(12) United States Patent
Vedantham et al.

(10) Patent No.: US 8,966,337 B2
(45) Date of Patent: Feb. 24, 2015

(54) POWERLINE COMMUNICATION FRAMES HAVING CRC WITHIN HEADER

(75) Inventors: Ramanuja Vedantham, Allen, TX (US); Gang Xu, Allen, TX (US); Kumaran Vijayasankar, Dallas, TX (US); Anand G. Dabak, Plano, TX (US); Tarkesh Pande, Dallas, TX (US); Il Han Kim, Dallas, TX (US); Xiaolin Lu, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 170 days.

(21) Appl. No.: 13/528,191

(22) Filed: Jun. 20, 2012

(65) Prior Publication Data

US 2012/0324322 A1 Dec. 20, 2012

Related U.S. Application Data

(60) Provisional application No. 61/498,971, filed on Jun. 20, 2011.

(51) Int. Cl.
*H03M 13/00* (2006.01)
*G06F 11/10* (2006.01)
*H03M 13/09* (2006.01)

(52) U.S. Cl.
CPC ............ *G06F 11/1004* (2013.01); *H03M 13/09* (2013.01)
USPC .......................................................... 714/758

(58) Field of Classification Search
CPC combination set(s) only.
See application file for complete search history.

(56) References Cited

U.S. PATENT DOCUMENTS

| | | | | |
|---|---|---|---|---|
| 4,642,607 A * | 2/1987 | Strom et al. | .................. | 307/104 |
| 5,235,619 A * | 8/1993 | Beyers et al. | .................. | 375/260 |
| 6,980,090 B2 * | 12/2005 | Mollenkopf | .................. | 375/258 |
| 7,756,030 B2 * | 7/2010 | Clave et al. | ................. | 370/230.1 |
| 8,170,524 B2 | 5/2012 | Abbot et al. | | |
| 2006/0126617 A1 * | 6/2006 | Cregg et al. | .................. | 370/389 |
| 2008/0037784 A1 * | 2/2008 | Corcoran et al. | ............. | 380/255 |
| 2008/0224889 A1 * | 9/2008 | Wyk et al. | ................ | 340/870.01 |
| 2010/0271945 A1 * | 10/2010 | Clave et al. | ................. | 370/230.1 |
| 2011/0255557 A1 | 10/2011 | Varadarajan et al. | | |
| 2012/0051401 A1 * | 3/2012 | Monier et al. | ................ | 375/134 |

* cited by examiner

*Primary Examiner* — Guerrier Merant
(74) *Attorney, Agent, or Firm* — Steven A. Shaw; Frederick J. Telecky, Jr.

(57) ABSTRACT

A method of powerline communications including a first node and at least a second node on a powerline communications (PLC) channel in a PLC network. The first node sends a physical layer (PHY) data frame on the PLC channel including a preamble, a PHY header, a MAC header and a MAC payload. The MAC header includes a Cyclic Redundancy Check (CRC) field (MH-CRC field). The second node receives the data frame, parses the MAC header to reach the MH-CRC field, and performs CRC verification using the MH-CRC field to verify the MAC header. If the CRC verification is successful, (i) the second node parses another portion of the MAC header to identify a destination address of the data frame and (ii) to determine whether the data frame is intended for the second node from the destination address.

20 Claims, 2 Drawing Sheets

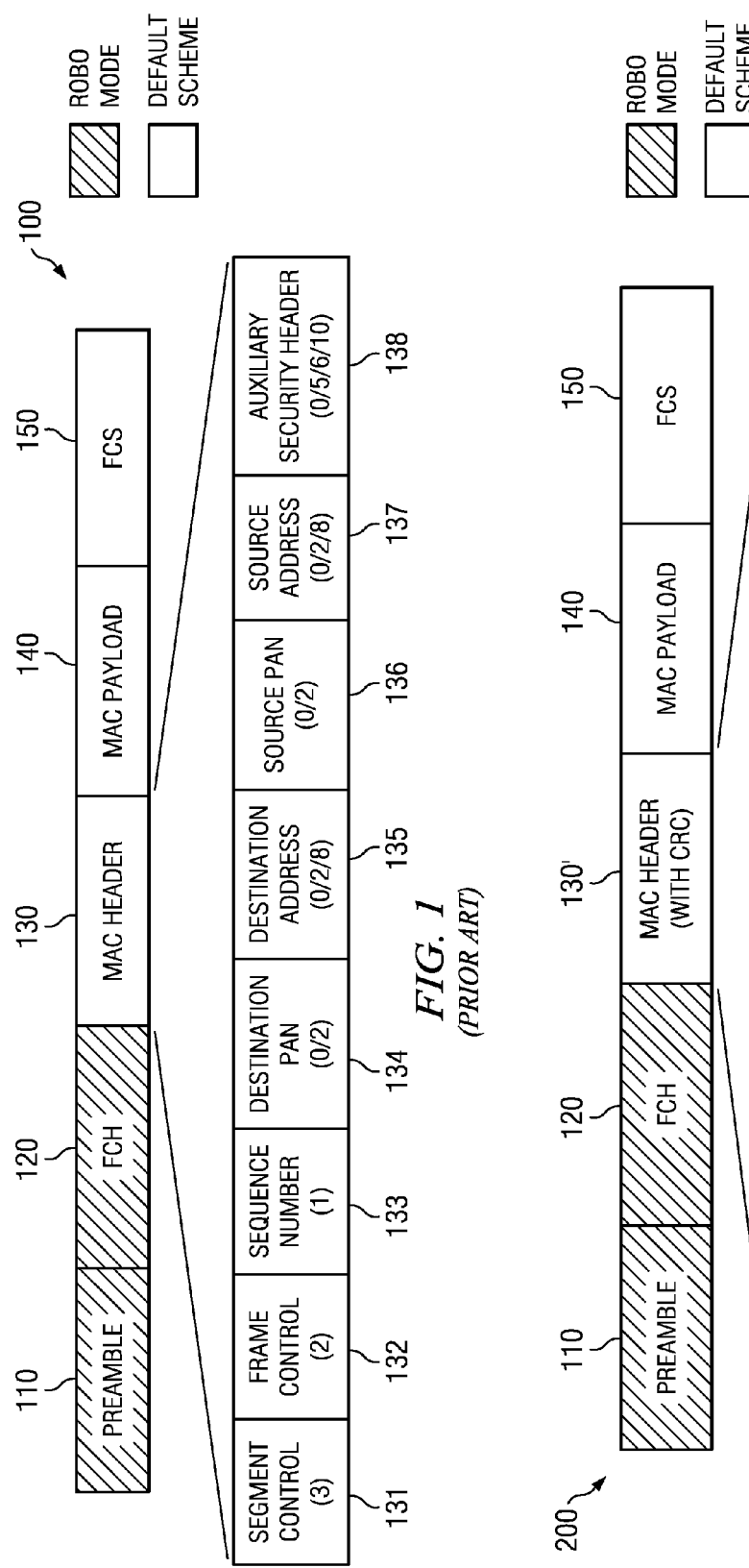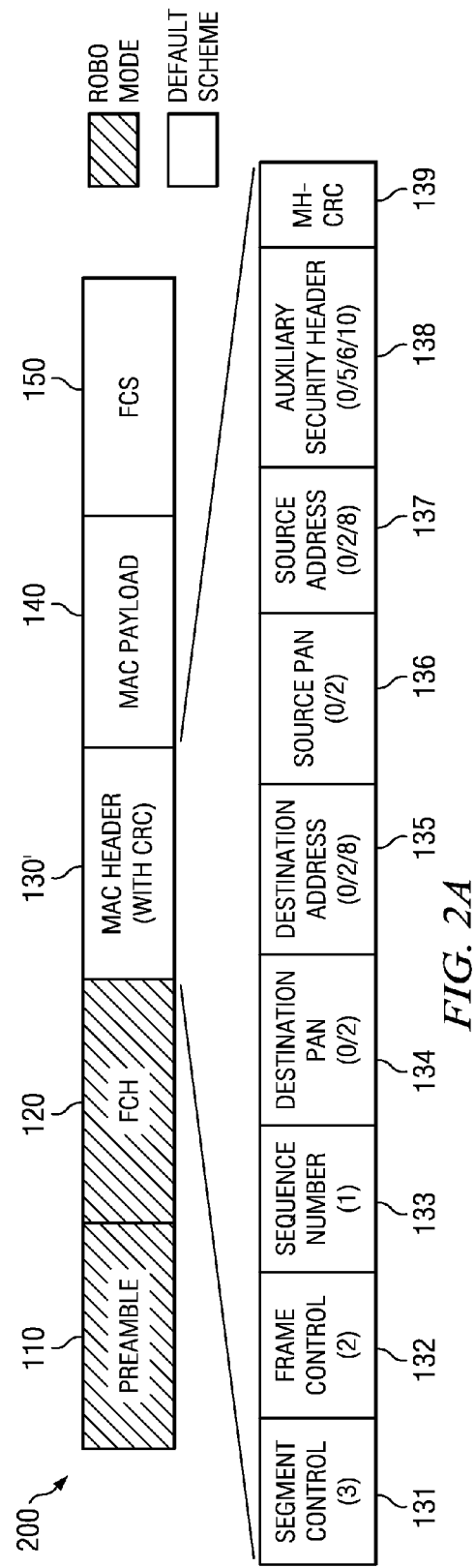

US 8,966,337 B2

POWERLINE COMMUNICATION FRAMES HAVING CRC WITHIN HEADER

CROSS REFERENCE TO RELATED APPLICATIONS

This application and the subject matter disclosed herein claims the benefit of Provisional Application Ser. No. 61/498,971 entitled "Addition of MAC Header CRC inside MAC Header for IEEE P1901.2 Devices", filed Jun. 20, 2011, which is herein incorporated by reference in its entirety.

FIELD

Disclosed embodiments relate generally to the field of powerline communications and, more specifically, to frame structures for powerline communications.

BACKGROUND

Power line communications (PLC) include systems for communicating data over the same medium (i.e., a wire or conductor) that is also used to transmit electric power to residences, buildings, and other premises. Once deployed, PLC systems may enable a wide array of applications, including, for example, automatic meter reading and load control (i.e., utility-type applications), automotive uses (e.g., charging electric cars), home automation (e.g., controlling appliances, lights, etc.), and/or computer networking (e.g., Internet access), to name only a few.

FIG. 1 shows the structure of a physical layer (PHY) data frame 100 for an orthogonal frequency-division multiplex (OFDM) PHY based on the IEEE P1901.2 standard, including the various fields in the MAC header 130 shown. Data frame 100 includes a preamble 110, a PHY header shown as frame control header (FCH) 120, a media access control (MAC) header 130, a MAC (data) payload 140, and a Frame Check Sequence (FCS) 150.

MAC header 130 includes segment control 131, frame control 132, Seq. No. 133, destination PAN 134, destination address 135, source PAN 136, source address 137, and auxiliary security header 138. The preamble 110 and FCH 120 are indicated as being ROBO mode (Robust OFDM mode) based on ROBO modulation as used in IEEE P1901.2. ROBO modulation is robust in the sense that it may provide four times extra redundancy parity bits by using a repetition code and therefore the network may more reliably deliver data under severe channel conditions. More generally for PLC network communications, the preamble and header of the PHY frame are both generally sent in the most robust modulation scheme available, typically being in a more robust modulation as compared to the modulation used in the other frame portions, including the MAC payload 140.

The IEEE P1901.2 specification states the following with respect to the transmission of the negative acknowledgment (NACK) frame "The receiver will send NACK to the originator if it is requested and the received MAC frame is corrupted and cannot be recovered by PHY". It is possible that the MAC header (specifically the destination address 135) in the data frame 100 may be corrupted and thus a node in the network that is not the intended receiver may receive the data frame despite not being intended to be the receiver, and thus become the node transmitting the NACK. The IEEE P1901.2 specification also has no mechanism to distinguish between MAC header corruption and MAC payload corruption.

SUMMARY

Disclosed embodiments recognize PLC standards that require the receiver to send a NACK to the originator node (when requested by the originator) when the received data frame is corrupted and cannot be recovered, introduces ambiguity in the receiver's transmission of the NACK. Specifically, as noted above, it is possible that the MAC header (specifically its destination address) in the received data frame may be corrupted and a node that is actually not the intended receiver may instead receive the data frame and thus be the node transmitting the NACK.

Disclosed embodiments add a cyclic redundancy check (CRC) field inside the MAC header (a "MH-CRC") of data frames to allow the receiving node to verify the MAC header portion of the data frame. If the MH-CRC verification is successful, the remaining portion of the MAC header can be parsed to determine if the data frame is intended for the node. Disclosed embodiments also include acknowledgement (ACK) or negative acknowledgement (NACK) frames having a CRC inside its PHY header that can be sent responsive to a disclosed data frame. The CRC in the PHY header of the ACK/NACK frame is the same CRC as the one in the data frame (MH-CRC), which can thus be used for identification purposes by the source of the data frame to determine whether the ACK/NACK sent in response to the data frame is indeed for it, which may be contrasted with conventional ACK/NACK frames which do not include a source or destination address.

Having a disclosed data frame with a CRC inside the MAC header allows unintended receiving nodes (nodes that are not the intended receiver) that receive such a data frame to skip payload decoding, which has no value for the unintended receiving node (the frame received was not intended for it). Disclosed frames having a MH-CRC thus allow a reduction in the communication device's power consumption by allowing full decoding of only relevant (intended) data frames received.

Disclosed frames also address the problem of ambiguity in the transmission of NACK frames described above, by allowing the receiver to differentiate between MAC header corruption from MAC payload corruption, so that the receiver can transmit a NACK frame only when the MAC Header CRC verification is successful while the MAC payload is corrupted.

BRIEF DESCRIPTION OF THE DRAWINGS

Reference will now be made to the accompanying drawings, which are not necessarily drawn to scale, wherein:

FIG. 1 shows the structure of a PHY data frame for the IEEE P1901.2 standard including the various MAC header fields.

FIG. 2A shows the structure of a disclosed PHY data frame having the various MAC header fields shown in FIG. 1 along with a disclosed MH-CRC field inside the MAC header, according to an example embodiment.

DETAILED DESCRIPTION

Disclosed embodiments now will be described more fully hereinafter with reference to the accompanying drawings. Such embodiments may, however, be embodied in many different forms and should not be construed as limited to the embodiments set forth herein. Rather, these embodiments are provided so that this disclosure will be thorough and complete, and will fully convey the scope of this disclosure to those having ordinary skill in the art. One having ordinary skill in the art may be able to use the various disclosed embodiments and there equivalents. As used herein, the term "couple" or "couples" is intended to mean either an indirect or direct electrical connection, unless qualified as in "communicably coupled" which includes wireless connections. Thus, if a first device couples to a second device, that connection may be through a direct electrical connection, or through an indirect electrical connection via other devices and connections.

Figure 2B:
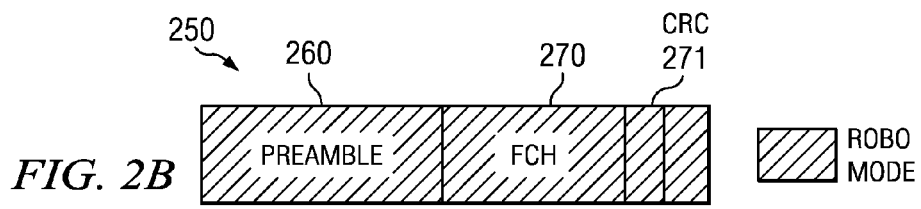
FIG. 2B shows the structure of a disclosed PHY ACK or NACK frame having a preamble and a PHY header including a CRC field for identification purposes, according to an example embodiment.

FIG. 2A shows the structure of a disclosed PHY data frame 200 having the various MAC header fields shown in FIG. 1 along with a disclosed MH-CRC field 139 inside the MAC header shown as MAC header 130', according to an example embodiment. The MH-CRC field 139 in one embodiment is 2-bytes (e.g., 16 bits) long. PHY data frame 200 and PHY ACK/NACK frame 250 described below relative to FIG. 2B allow a receiving node to determine if a received frame is intended for it, which in the case of a data frame allows the receiving node to not decode other parts of the data frame 200 including the MAC payload 140 if the data frame 200 is determined to not be intended for that node. Also, since the encoding rate for the MH-CRC 139 is generally the same as the rest of the frame payload, the overhead to add a disclosed MH-CRC, such as a 2-byte MH-CRC, is small, while solving the node ambiguity problem described above pertaining to transmission of NACK frames using the IEEE P1901.2 standard specification. Disclosed data frames also allow for PLC devices that are not the intended receiver of the data frame to skip the decoding of the MAC payload, while providing an accurate estimation of the frame length.

Disclosed MH-CRCs may also be used in the PHY headers of ACK/NACK frames sent responsive to a disclosed data frame, instead of the payload CRC field from a received frame used by conventional ACK/NACK frames. The CRC information in the PHY header of disclosed ACK/NACK frames is the same CRC information as the CRC information in the data frame and can thus be used for identification purposes by the source of the data frame to determine whether the ACK/NACK sent in response to the data frame is indeed for it. FIG. 2B shows the structure of a disclosed PHY ACK/NACK frame 250 having the MH-CRC of the data frame shown as CRC 271 inside the FCH 270. The other fields of FCH 270 including Phase Detection Counter (PDC), Modulation type, delimiter type (DT), frame length, tone map, etc. are not shown for simplicity. It can be observed in the case of NACK transmissions, the payload CRC in received data frames may be corrupted so that conventional NACKs may be unreliable for identification purposes, whereas the use of the MH-CRC in the NACK frame, such as in the CRC 271 in PHY ACK/NACK frame 250 becomes more reliable.

Disclosed frames having a MH-CRC 139 also provides the benefit of reducing the time to wait for the next transmission attempt from a relatively long duration Extended Interframe Space (EIFS) to a reduced wait time based on the frame length specified in the frame length field of the PHY header for frames which have passed MH-CRC verification. In the IEEE P1901.2 specification, all nodes wait the full EIFS irrespective of whether the MAC header was correct or not if the overall CRC for the header and payload fails. Moreover, in contrast to the IEEE P1901.2 specification in the case of a data frame, where nodes that are not the intended receiver of the frame still decode the payload, disclosed embodiment allow nodes that are not the intended receiver of the data frame to skip the payload decoding since the data frame is not intended for them and thus of no value, reducing the device power consumption by decoding only relevant (intended) frames.

Disclosed frames having a MH-CRC 139 also allows devices to initiate other resulting responses based on information in the MAC header 130'. This is achieved because the header information is available immediately after the MH-CRC 139 passes.

Figure 3:
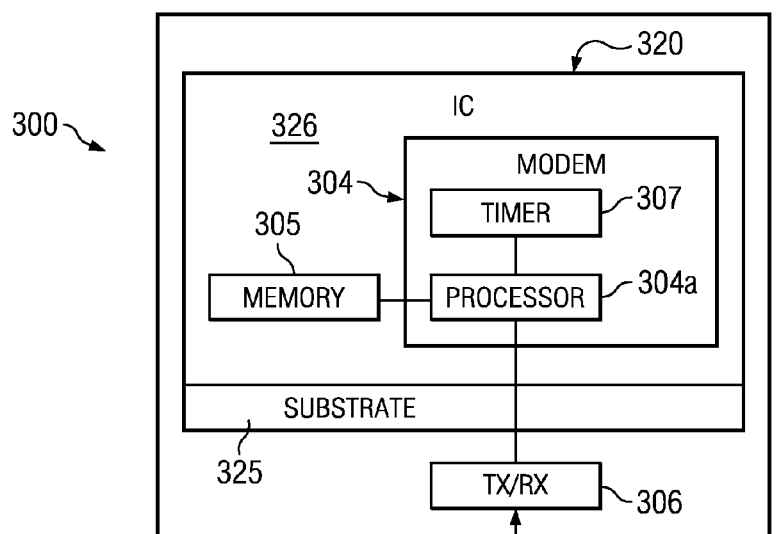
FIG. 3 is a block diagram schematic of a communication device having a disclosed modem that implements an algorithm that compiles frames including data frames having a MH-CRC inside the MAC header, according to an example embodiment.

FIG. 3 is a block diagram schematic of a communication device 300 having a disclosed modem 304 that runs a disclosed frame compiling algorithm which implements compiling of data frames including a CRC field inside the MAC header (MH-CRC field) for powerline communications, according to an example embodiment. The frame compiling algorithm can also implement compiling of disclosed ACK or NACK frames having a CRC inside its PHY header, where the CRC information in the PHY header of the ACK/NACK frame is the same CRC information as the CRC information in the data frame, which can be sent responsive to a disclosed data frame for identification purposes by the source of the data frame to determine whether the ACK/NACK sent in response to the data frame is indeed for it as described above. Communications device 300 can be used at a service node (which includes switch nodes and terminal nodes) or a base (data concentrator) node in the PLC communications network.

Modem 304 includes a processor (e.g., a digital signal processor, (DSP)) 304a coupled to an associated memory 305 that that stores a disclosed frame compiling algorithm which provides code for compiling frames including PHY frames having a MH-CRC, including as described above both data frames and ACK/NACK frames. Memory 305 comprises non-transitory machine readable storage, for example, static random-access memory (SRAM). The processor 304a is programmed to implement a disclosed frame compiling algorithm. Modem 304 includes a timer 307, such as for ACK transmission, Carrier Sense Multiple Access/collision avoidance (CSMA)/CA) back-off and data transmission purposes.

The PLC transceiver (TX/RX) 306 is communicably coupled to the modem 304 for coupling of the communications device 300 to a first node on the powerline 340. Transceiver 306 facilitates communications with other SNs and the BN on the powerline 340.

The memory 305 can further store a disclosed MH-CRC operating algorithm including code for responding to receiving a disclosed data frame from a second node, where the processor 304a can be programmed to implement the MH-CRC operating algorithm. The MH-CRC operating algorithm includes parsing the MAC header to reach the MH-CRC field, performing CRC verification using the MH-CRC field to verify the MAC header, and if the CRC verification is successful, (i) parsing another portion of the MAC header to identify a destination address of the received frame, and (ii) determining whether the received frame is intended for the node from the destination address.

The modem 304 is shown formed on an integrated circuit (IC) 320 comprising a substrate 325 having a semiconductor surface 326, such as a silicon surface. Memory 305 may be included on the IC 320. In another embodiment the modem 304 is implemented using 2 processor chips, such as 2 DSP chips. Besides the DSP noted above, the processor 304a can comprise a desktop computer, laptop computer, cellular phone, smart phone, or an application specific integrated circuit (ASIC).

Disclosed modems 304 and disclosed communications devices 300 can be used in a PLC network to provide a networked device that in service is connected to a powerline via a power cord. In general, the "networked device" can be any equipment that is capable of transmitting and/or receiving information over a powerline. Examples of different types of networked devices include, but are not limited or restricted to a computer, a router, an access point (AP), a wireless meter, a networked appliance, an adapter, or any device supporting connectivity to a wired or wireless network.

Figure 4:
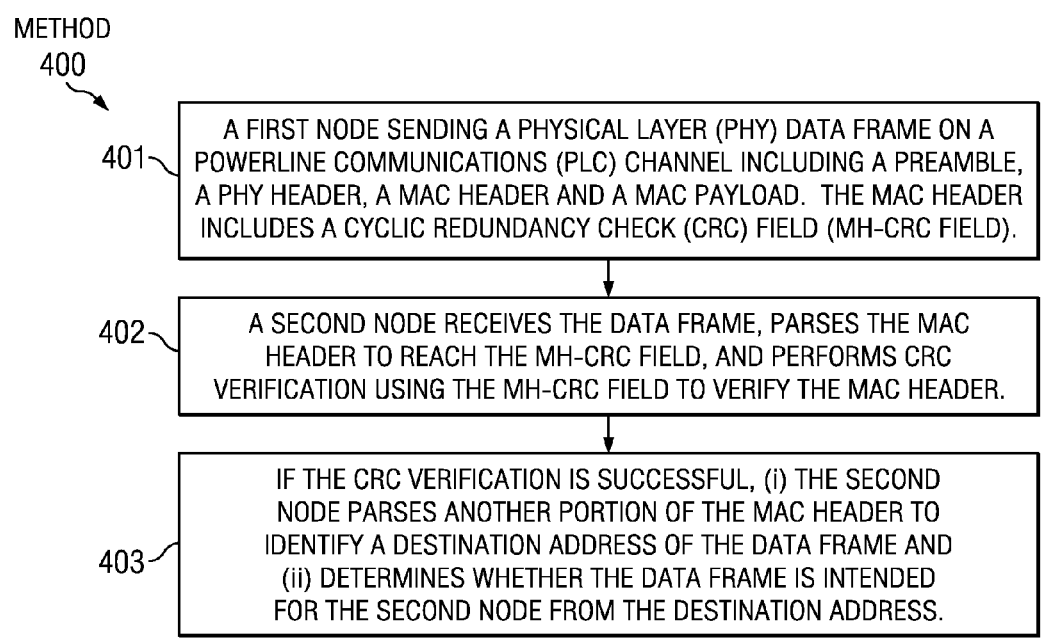
FIG. 4 is a flowchart for an example method for powerline communications using data frames having a MH-CRC field inside the MAC header, according to an example embodiment.

FIG. 4 is a flowchart for an example method 400 of powerline communications including a first node and at least a second node on PLC channel in a PLC network. In step 401 the first node sends a data frame on the PLC channel including a preamble, a PHY header, a MAC header, and a MAC payload. The MAC header in the frame includes a CRC field (MH-CRC field 139). In step 402, the second node receives the data frame, parses the MAC header to reach the MH-CRC field, and performs CRC verification using the MH-CRC field to verify the MAC header. In step 403, if the CRC verification is successful, (i) the second node parses another portion of the MAC header to identify a destination address of the data frame and (ii) determines whether the data frame is intended for the second node from the destination address.

When the data frame is corrupted, the second node can distinguish corruption of the MAC header from corruption of the MAC payload, and the second node can transmit an ACK or NACK frame to the first node only when the CRC verification is successful and the MAC payload is corrupted. In this embodiment a NACK can this be sent only when the MAC Header CRC passes, the destination address in the MAC header 130' matches the receiver, and the payload CRC fails (i.e. the payload is corrupted). The ACK or NACK frame can include the MH-CRC field from the data frame received within its PHY header (see description above relative to FIG. 2B). When the (ii) determining determines the data frame is not intended for the second node, the second node can skip decoding of the MAC payload 140, which conserves energy.

In one embodiment, if the CRC verification is successful, other nodes in the PLC network can use the frame length information in a PHY header field to obtain the frame transmission end time to set their Network Allocation Vector (NAV) to provide an appropriate wait time to extend until the transmission ends before initiating a transmission. These nodes can follow the PLC network's channel access mechanism for a transmission after the expiration of NAV.

Many modifications and other embodiments of the invention will come to mind to one skilled in the art to which this Disclosure pertains having the benefit of the teachings presented in the foregoing descriptions, and the associated drawings. Therefore, it is to be understood that embodiments of the invention are not to be limited to the specific embodiments disclosed. Although specific terms are employed herein, they are used in a generic and descriptive sense only and not for purposes of limitation.

We claim:

1. A method of powerline communications including a first node and at least a second node on a powerline communications (PLC) channel in a PLC network including a base data concentrator node, comprising:

said first node sending a physical layer (PHY) data frame, including a Cyclic Redundancy Check (CRC) information, on said PLC channel comprising a preamble, a PHY header, a MAC header and a MAC payload, wherein said MAC header includes a Cyclic Redundancy Check (CRC) field (MH-CRC field) in addition to the data frame (CRC) information;

said second node receiving said data frame, said second node:

parsing said MAC header to reach said MH-CRC field; and performing CRC verification using said MH-CRC field to verify said MAC header, and wherein if said CRC verification is successful, (i) parsing another portion of said MAC header to identify a destination address of said data frame and (ii) determining whether said data frame is intended for said second node from said destination address.

2. The method of claim 1, wherein when said data frame is corrupted, further comprising said second node distinguishing corruption of said MAC header from corruption of said MAC payload, and said second node transmitting an acknowledgment (ACK) or negative acknowledgment (NACK) frame to said first node only when said CRC verification is successful, said determining determines said data frame is intended for said second node from said destination address, and said MAC payload is corrupted.

3. The method of claim 2, wherein said second node transmits said ACK or said NACK frame with said MH-CRC field within a PHY header of said ACK or said NACK frame.

4. The method of claim 1, wherein if said determining determines said data frame is not intended for said second node, said second node not decoding said MAC payload.

5. The method of claim 1, wherein if said CRC verification is successful, said second node setting its Network Allocation Vector (NAV) based on a frame transmission time indicated in said PHY header and transmitting on said PLC channel after an expiration of said NAV.

6. A modem for communications on a powerline communications (PLC) channel in a PLC network including a base data concentrator node, comprising:

a processor, wherein said processor is communicably coupled to a memory which stores instructions comprising a frame compiling algorithm including code for compiling data frames, and wherein said processor is programmed to implement said frame compiling algorithm, said frame compiling algorithm:

compiling a first physical layer (PHY) data frame with a Cyclic Redundancy Check (CRC) information, said compiling comprising:

a preamble;

a PHY header;

a MAC header; and a MAC payload, wherein said MAC header includes a Cyclic Redundancy Check (CRC) field (MH-CRC field) in addition to the data frame (CRC) information, and wherein said modem is configured for coupling to a PLC transceiver at a first node in said PLC network to provide said first data frame to said PLC transceiver so that said PLC transceiver transmits said first data frame over said PLC channel to at least a second node.

7. The modem of claim 6, wherein said modem is formed on an integrated circuit (IC) comprising a substrate having a semiconductor surface, wherein said processor comprises a digital signal processor (DSP).

8. The modem of claim 6, wherein said memory further stores instructions comprising a MH-CRC operating algorithm including code for responding to receiving a second data frame from said second node comprising a second preamble, a second PHY header, a second MAC header and a second MAC payload, wherein said second MAC header includes a second Cyclic Redundancy Check (CRC) field (second MH-CRC field), and wherein said processor is programmed to implement said MH-CRC operating algorithm, said MH-CRC operating algorithm operating on said second data frame, comprising the following regarding said second data frame:

parsing said second MAC header to reach said second MH-CRC field; and performing CRC verification using said second MH-CRC field to verify said second MAC header, and wherein if said CRC verification is successful,
(i) parsing another portion of said second MAC header to identify a destination address of said second data frame and
(ii) determining whether said second data frame is intended for said first node from said destination address.

9. The modem of claim 8, wherein said MH-CRC operating algorithm further implements the following processing:

determining whether said second data frame is corrupted;
distinguishing corruption of said second MAC header from corruption of said second MAC payload; and
transmitting an acknowledgment (ACK) or negative acknowledgment (NACK) frame to said second node only when said CRC verification is successful, wherein said determining determines said second data frame is intended for said first node from said destination address, and said second MAC payload is corrupted.

10. The modem of claim 9, wherein said first node transmits said ACK or said NACK frame with said second MH-CRC field within a PHY header of said ACK or said NACK frame.

11. The modem of claim 9, wherein if said determining determines said second data frame is not intended for said first node, said MH-CRC operating algorithm not decoding said second MAC payload.

12. The modem of claim 8, wherein if said CRC verification is successful, said MH-CRC operating algorithm having said first node set its Network Allocation Vector (NAV) based on a frame transmission time indicated in said second PHY header and transmitting on said PLC channel after an expiration of said NAV.

13. A communications device for communications on a powerline communications (PLC) channel in a PLC network including a base data concentrator node, comprising:

a memory which stores instructions comprising a frame compiling algorithm including code for compiling frames,
a modem coupled to said memory, said modem comprising:
a processor programmed to implement said frame compiling algorithm, said frame compiling algorithm compiling a first physical layer (PHY) data frame with a Cyclic Redundancy Check (CRC) information, said data frame comprising a preamble, a PHY header, a MAC header and a MAC payload, wherein said PHY header includes a destination address field having a destination address therein, wherein said MAC header includes a Cyclic Redundancy Check (CRC) field (MH-CRC field) in addition to the data frame (CRC) information; and
a PLC transceiver communicably coupled to said modem at a first node in said PLC network for transmitting frames including said first data frame over said PLC channel to at least a second node.

14. The communications device of claim 13, wherein said modem is formed on an integrated circuit (IC) comprising a substrate having a semiconductor surface, wherein said processor comprises a digital signal processor (DSP).

15. The communications device of claim 13, wherein said memory further stores instructions comprising a MH-CRC operating algorithm including code for responding to receiving a second data frame from said second node comprising a second preamble, a second PHY header, a second MAC header and a second MAC payload, wherein said second MAC header includes a second Cyclic Redundancy Check (CRC) field (second MH-CRC field), and wherein said processor is programmed to implement said MH-CRC operating algorithm, said MH-CRC operating algorithm operating on said second data frame, comprising:

parsing said second MAC header to reach said second MH-CRC field; and performing CRC verification using said second MH-CRC field to verify said second MAC header, and wherein if said CRC verification is successful,
(i) parsing another portion of said second MAC header to identify a destination address of said second data frame and
(ii) determining whether said second data frame is intended for said first node from said destination address.

16. The communications device of claim 15, wherein said MH-CRC operating algorithm further comprises:

determining whether said second data frame is corrupted;
distinguishing corruption of said second MAC header from corruption of said second MAC payload; and
transmitting an acknowledgment (ACK) or negative acknowledgment (NACK) frame to said second node only when said CRC verification is successful and wherein said determining determines said second data frame is intended for said first node from said destination address, and said second MAC payload is corrupted.

17. The communications device of claim 16, wherein said first node transmits said ACK or said NACK frame with said second MH-CRC field within a PHY header of said ACK or said NACK frame.

18. The communications device of claim of claim 16, wherein if said determining determines said second data frame is not intended for said first node, said MH-CRC operating algorithm not decoding said second MAC payload.

19. The communications device of claim 15, wherein if said CRC verification is successful, said MH-CRC operating algorithm setting a Network Allocation Vector (NAV) based on a frame transmission time indicated in said second PHY header for said first node to transmit on said PLC channel after an expiration of said NAV.

20. The method of claim 1 wherein the PLC network is based on an Institute of Electrical and Electronics Engineers IEEE P1901.2 standard.

* * * * *